United States Patent
Lee et al.

(10) Patent No.: US 7,741,622 B2
(45) Date of Patent: Jun. 22, 2010

(54) EXPOSURE DEVICE

(75) Inventors: Duk Lee, Machida (JP); Jun Ishikawa, Machida (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 211 days.

(21) Appl. No.: 12/148,339

(22) Filed: Apr. 18, 2008

(65) Prior Publication Data

US 2008/0267248 A1    Oct. 30, 2008

(30) Foreign Application Priority Data

Apr. 26, 2007   (JP)   ............................... 2007-116452

(51) Int. Cl.
*G21K 5/00* (2006.01)
*G01J 1/42* (2006.01)

(52) U.S. Cl. .................. 250/492.22; 250/372; 250/365; 250/461.1; 250/504 R; 378/34

(58) Field of Classification Search ................. 250/365, 250/372, 393, 461.1, 504 R, 492.1, 492.2, 250/492.22; 378/34
See application file for complete search history.

(56) References Cited

U.S. PATENT DOCUMENTS

| | | | | |
|---|---|---|---|---|
| 5,115,456 A | * | 5/1992 | Kimura et al. | ................ 378/35 |
| 7,006,197 B2 | * | 2/2006 | Lee | .............................. 355/67 |
| 7,622,720 B2 | * | 11/2009 | Nonaka et al. | .............. 250/372 |
| 2004/0240210 A1 | * | 12/2004 | Lee | ............................. 362/331 |
| 2008/0237490 A1 | * | 10/2008 | Lee et al. | ................. 250/492.1 |
| 2008/0258069 A1 | * | 10/2008 | Nonaka et al. | .............. 250/372 |
| 2008/0267248 A1 | * | 10/2008 | Lee et al. | .................... 372/107 |
| 2009/0039292 A1 | * | 2/2009 | Lee et al. | ................. 250/492.2 |
| 2009/0196946 A1 | * | 8/2009 | Kihara et al. | ............... 425/171 |

FOREIGN PATENT DOCUMENTS

| | | |
|---|---|---|
| JP | 2006-113413 | 4/2006 |
| JP | 2006-337475 | 12/2006 |
| JP | 2006-343684 | 12/2006 |

* cited by examiner

*Primary Examiner*—Bernard E Souw
(74) *Attorney, Agent, or Firm*—Dilworth & Barrese LLP

(57) ABSTRACT

The present invention presents an exposure device, which includes an optical source for emitting a UV ray, a lighting system for shaping the UV ray into a collimated light beam, an aperture member for producing rectangular first and second light beams based on the light beam from lighting system by using the first and second rectangular windows, first and second spatial light modulators for spatially modulating the first and second light beams, respectively, and first and second projection lighting systems for guiding the modulated first and second light beams to the object.

14 Claims, 11 Drawing Sheets

EXPOSURE DEVICE

CROSS-REFERENCE TO RELATED APPLICATIONS

This application claims the benefit of Japanese Patent Application 2007-116452 filed on Apr. 26, 2007, the disclosure of which is incorporated herein by reference.

BACKGROUND OF THE INVENTION

1. Field of the Invention

The present invention relates to an exposure device for forming patterns on a surface of a flat-sheet material, including a substrate for an electronic circuit, a glass substrate for an LCD and a glass element substrate for a PDP.

2. Description of the Related Art

In general, substrates for electronic circuits or printed circuits are applied to portable phones or various types of PCs. On a substrate of this type, multiple fine patterns, lands and via-holes tend to be formed with great precision. In order to follow this trend, an exposure device which is used in an exposure process for forming patterns needs to possess a technique for generating high-intensity and precise-collimated light beams.

A general type, that is, contact or projection type exposure device is required to handle many different types of substrates in a short period. Such an exposure device needs to contain masks to form patterns. Accordingly, multiple different masks are prepared depending on the types of substrates to be processed. However, those masks are hard to prepare, exchange or maintain, thus making it difficult to treat many different substrates efficiently.

Because of this disadvantage, interest is growing in a direct type exposure system and a device incorporating this system. This direct type exposure system transfers patterns from CAD data to a substrate by means of light beams, so that masks are unnecessary (see JP A 2006-113413, JP A 2006-343684 and JP A 2006-337475). However, a typical direct exposure device tends to have a low reaction speed in forming patterns, because its light source is a laser of a short wavelength such as 405 nm. Hence, efficient direct type devices have been highly in demand.

In addition to the inefficient exposure operation as described above, a typical direct exposure device involves a cost increase. This is because it is equipped with many spatial light modulation elements for treating large-size substrates. If high-intensity light beams are irradiated on those many spatial light modulation elements, then many light sources are required, thus leading to the increase in the material costs.

The direct type exposure device of JP A 2006-343684 or JP A 2006-337475 is designed to address this disadvantage. Specifically, this device has seven low-illumination UV lamps and optical fibers. Further, the rays outputted from the lamps are supplied by the optical fibers to one or more optical systems. Moreover, as shown in FIG. 6 of those two documents, in both devices, the input end of the fiber is positioned at the secondary focal point of the elliptic mirror. However, the illumination of the seven UV lamps is difficult to adjust, thus making it almost impossible to control the ray in accordance with the photo-sensitive property of an object to be processed.

Taking the above description into account, the present invention has been conceived. An object of the present invention is to provide a direct type exposure device which works efficiently. An additional object of the present invention is to present a direct type exposure device which has a few optical sources and many digital micro-mirror devices (DMDs) functioning as spatial light modulation devices.

SUMMARY OF THE INVENTION

According to a first aspect of the present invention, there is provided, an exposure device for forming predetermined patterns onto an object, comprising:

a1) an optical source for emitting a UV ray;

a2) a lighting system for shaping the UV ray into a collimated light beam;

a3) an aperture member having first and second windows, the aperture member for producing first and second light beams based on the collimated light beam by using the first and second windows, the aperture member being located in the collimated light beam;

a4) first and second light guiding systems for guiding the first and second light beams, respectively;

a5) first and second spatial light modulators for spatially modulating the first and second light beams that are guided by the first and second light guiding systems, respectively; and a6) first and second projection lighting systems for guiding the modulated first and second light beams to the object.

In this exposure device, the aperture member which is placed in the collimated beam from the lighting system produces the first and second light beams. The relationship between the light incident on the aperture member and the light outputted from the aperture member is not in compliance with "Helmholtz-Lagrange invariant." Accordingly, the exposure device can generate the four ideal light beams with constant magnification.

According to a second aspect of the present invention, there is provided, the exposure device of the first aspect, in which each of the first and second spatial light modulators has a rectangular reflection surface that includes a plurality of reflection elements, and in which each of the first and second windows of the aperture member has the substantially the same shape as that of the reflection surface of each of the first and second spatial light modulators.

In this exposure device, each of the first and second windows of the aperture member has substantially the same shape as that of the reflection surface of each of the first and second spatial light modulators. Hence, the light beams are irradiated to the reflection surfaces of the first and second spatial light modulators efficiently. Especially, the light beams are not irradiated to other surfaces. This prevents a support mechanism of the spatial light modulators from being heated, that is, from affecting the precision of operation of the spatial light modulators.

According to a third aspect of the present invention, there is provided, the exposure device of the second aspect, in which each of the first and second light guiding systems includes one or two total reflection elements.

In this exposure device, a small number of total reflection elements are used. Thus, the light beams are led to the first and second spatial light modulators with minimum attenuation.

According to a fourth aspect of the present invention, there is provided, the exposure device of the second or third aspect, in which each of the first and second light guiding systems has an iris adjustor which adjusts intensity of light by varying its opening area and which has a heatsink member In the exposure device of this aspect, when the light beam is split into the first and second light beams by the aperture members, the split beams may have different intensities. In this case, the iris adjustors eliminate this difference. Furthermore, since the iris adjustors tend to be heated, each of them is equipped with the heatsink for reducing its own temperature.

According to a fifth aspect of the present invention, there is provided, the exposure device of the first aspect, in which each of the first and second spatial light modulators has a rectangular reflection surface that includes a plurality of reflection elements, and in which each of the first and second windows of the aperture member has a fan-shape.

With the fan-shaped first and second windows, the aperture member can produce the first and second light beams efficiently, based on the light beam having the circular cross-section.

According to a sixth aspect of the present invention, there is provided, the exposure device of the fifth aspect, in which each of the first and second light guiding systems comprises a bundle of optical fibers, an end of which faces the aperture member and has a fan-shape in cross-section, and the other end of which faces the first and second spatial light modulators and has a rectangular shape in cross-section. In this exposure device, the light beams are led efficiently from the fan-shaped windows to the rectangular first and second spatial light modulator through the optical fibers.

Generally, light is scattered inside an optical fiber. Therefore, light is attenuated more greatly when it passes through an optical fiber than when it is reflected by a mirror. In the exposure device of this aspect, although the light beams pass through the optical fibers, they are guided efficiently so that its attenuation amount is low.

With the exposure device of the present invention, multiple split light beams can be created efficiently based on a ray emitted from an optical source.

BRIEF DESCRIPTION OF THE DRAWINGS

For more complete understanding of the present invention and the advantages hereof, reference is now made to the following description taken in conjunction with the accompanying drawings wherein.

DETAILED DESCRIPTION OF THE EXEMPLARY EMBODIMENTS OF THE INVENTION

Whole Structure of Exposure Device

Figure 1:
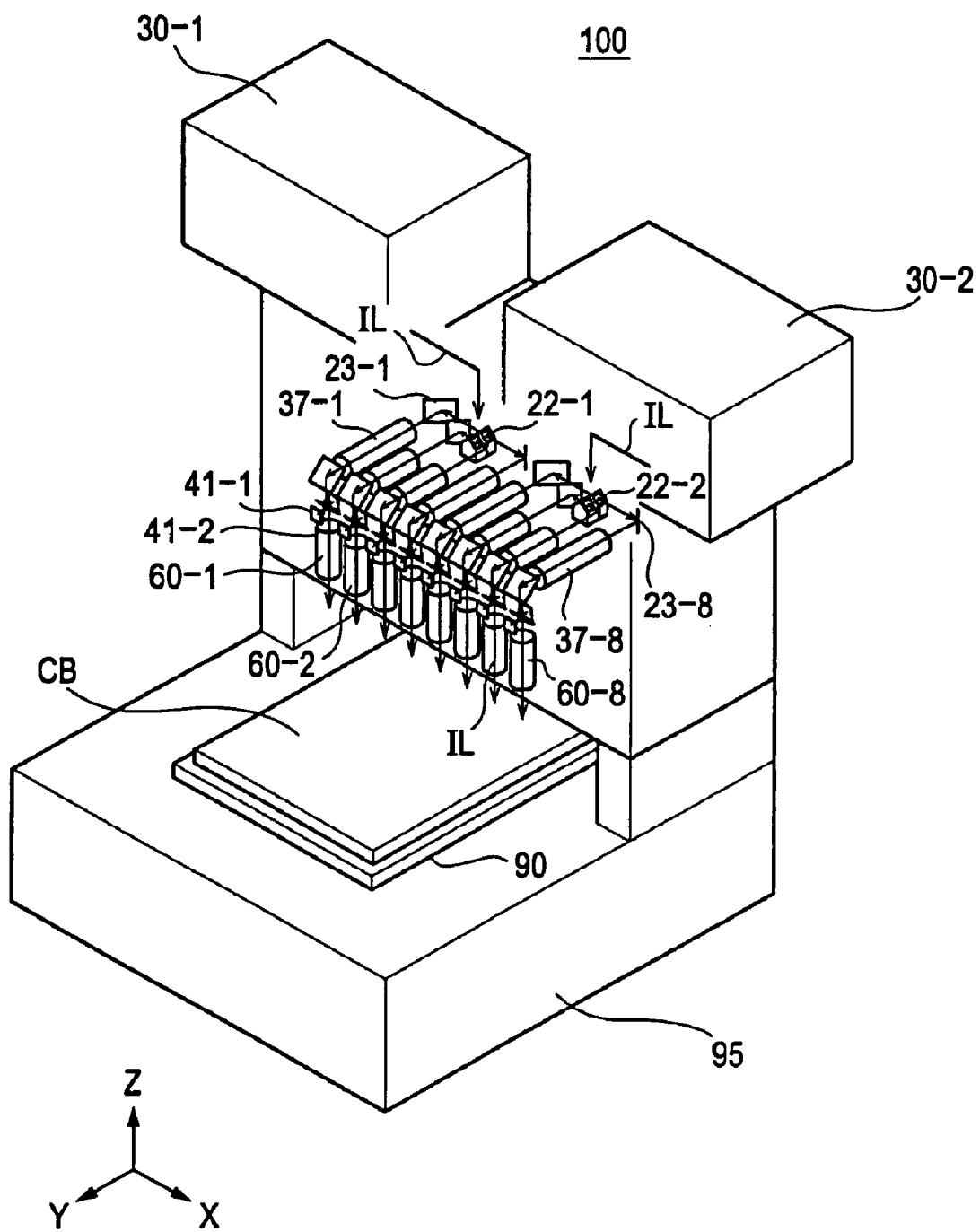
FIG. 1 is a schematically perspective view depicting an exposure device 100 according to one embodiment of the present invention.

FIG. 1 schematically shows an exposure device 100 according to an embodiment of the present invention. This exposure device 100 mainly includes lighting systems 30-1 and 30-2, light guiding systems 37-1 to 37-8, spatial light modulation systems (thereinafter referred to as "DMDs") 41-1 to 41-8, projection optical systems 60-1 to 60-8, and an object table 90. The reason why the two lighting systems (30-1 and 30-2) are used is to irradiate an object CB widely. These lighting systems 30-1 and 30-2 contain a first high-pressure mercury lamp 10-1 and a second high-pressure mercury lamp 10-2 (see FIG. 2), respectively.

Figure 2:
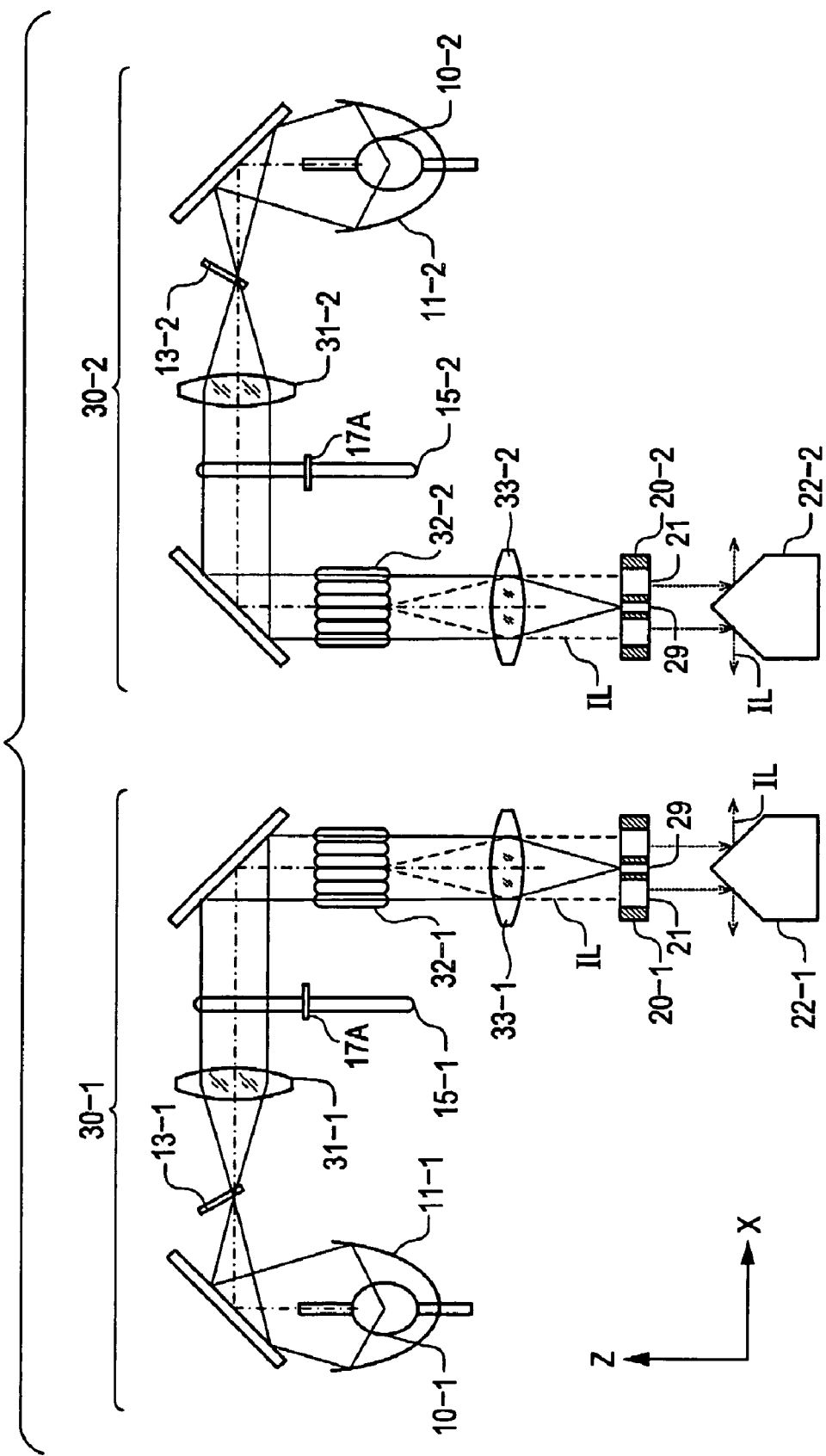
FIG. 2 is a schematic view depicting lighting systems 30-1 and 30-2 of the exposure device 100.

FIG. 2 schematically shows the lighting systems 30-1 and 30-2. Since both lighting systems have the identical structure, only the lighting system 30-1 will be described below.

In this drawing, the first high-pressure mercury lamp 10-1 is located at a primary focal point of an elliptic mirror 11-1. The elliptic mirror 11-1 reflects efficiently the UV ray emitted from the first high-pressure mercury lamp 10-1 toward a secondary focal point of an elliptic mirror 11-1. In this embodiment, the first high-pressure mercury lamp 10-1 is used, but the optical source is not limited to it in the present invention. Alternatively, a xenon or flash lamp may be utilized.

This first high-pressure mercury lamp 10-1 is designed to constantly emit a light beam IL while being supplied with electric power through a power supply controller (not shown). In this way, the intensity of the light beam IL is made stable. A shutter 13-1 is placed at the secondary focal point of the elliptic mirror 11-1 and blocks off the light beam IL when the device 100 does not need to irradiate the object CB. The light beam IL from the first high-pressure mercury lamp 10-1 concentrates at the secondary focal point. Accordingly, the shutter 13-1 is positioned at the secondary focal point, so that it does not have to move greatly to block off the light beam IL.

The lighting system 30-1 includes a collimator lens 31-1 and a fly-eye lens 32-1, and they shape the light beam IL into a beam of a uniform density. The light beam IL diverges from a point image at the secondary focal point, and is then incident on the collimator lens 31-1. This incident light beam is converted into a collimated beam, and is then inputted to a wavelength selection filter 15-1.

The wavelength selection filter 15-1 is composed of a combination of several filter elements. This combination is determined depending on the photoresist coated on the object. The light beam IL that has passed through the wavelength selection filter 15-1 has a desired wavelength range, and this beam is incident on the fly-eye lens 32-1 in order to make its density uniform.

The light beam IL of a uniform density enters the fly-eye lens 32-1. The fly-eye lens 32-1 is composed of multiple positive lens elements arrayed closely and laterally, while their individual center axes extend parallel to the optical axis of the fly-eye lens 32-1. The light beam entering the fly-eye lens 32-1 is subjected to the wavefront splitting by the lens elements. Thus, the fly-eye lens 32-1 forms multiple secondary light sources at its rear focal points or close to its rear surface. In this case, the secondary light sources are as many as the lens elements of the fly-eye lens 32-1. In other words, a substantial surface light source is formed at the rear focal point.

Note that in this embodiment, the fly-eye lens 32-1 functions as an optical integrator that controls a ray emitted from an optical source on an optical axis. This optical integrator is not limited to a fly-eye lens, and it may be a diffractive optical component, micro fly-eye lens composed of micro lens elements, and an internal reflection type rod-shaped integrator such as a hollow pipe, optical pipe or glass rod.

The light beam IL from the fly-eye lens 32-1 is incident on the condenser lens 33-1. Subsequently, the light beam IL passes through the condenser lens 33-1, and is then incident on and irradiated to the aperture member 20-1. Likewise, in the lighting system 30-2, the light beam IL is irradiated on the aperture member 20-2. When the light beam IL of a uniform density is irradiated on the aperture member 20-1 having the four opening windows 21 and the detection window 29 in parallel with the Z axis, that is, perpendicular to the aperture member 20-1, the light beam is split into four. Following this, the split beams IL are reflected by reflective optical element 22-1 made of a total reflection mirror or prism, and they then travel laterally.

Referring to FIG. 1 again, the eight light beams IL (formed by the aperture members 20-1 and 20-2 and the reflective optical elements 22-1 and 22-2) are reflected by a corresponding one of total reflection mirrors 23-1 to 23-8, and they then travel in parallel with the Y axis. Subsequently, the eight light beams IL are incident on a corresponding one of the light guiding systems 37-1 and 37-8.

The light beams IL are subjected to a beam shaping in the light guiding systems 37-1 to 37-8, so that they each have a predetermined shape and preset intensity. Following this, the light beams IL are thrown to the arrayed DMDs 41-1 to 41-8. The DMDs 41-1 to 41-8 spatially modulate the light beams IL based on an input image data. The light beams IL modulated by the DMDs 41-1 to 41-8 pass through the projection optical systems 60-1 and 60-8, respectively, so that each beam has a predetermined magnification. Finally, the light beams IL are irradiated to the object CB.

The projection optical systems 60-1 to 60-8 precisely adjust the magnifications of the light beams IL. As a result, the identical eight irradiated areas are created on the object. Moreover, the magnifications may be varied depending on the size of the object CB. The exposure device 100 has the eight projection optical systems 60-1 to 60-8 which are arrayed on the X axis.

Note that those DMDs 41-1 to 41-8 and the projection optical systems 60-1 to 60-8 are easy to fabricate and maintain.

The exposure device 100 includes a base 95 under the projection optical systems 60-1 to 60-8 with respect to the Z axis, and it supports the lighting systems 30-1 and 30-2, the light guiding systems 37-1 to 37-8 and the projection optical systems 60-1 and 60-8. The base 95 has a pair of guide rails, and an object table 90 is mounted on the guide rails. This object table 90 is driven by a mechanism (not shown) composed of, for example, a ball screw and a stepping motor. With this mechanism, the object table 90 is moved on the guide rails lengthwise or in parallel with the Y axis relative to the projection optical systems 60-1 to 60-8. On the object table 90, a photoresist-coated substrate is set as the object CB. This object CB is fixed onto the object table 90 by means of negative pressure. In the case where the projection optical system 60-1 to 60-8 cannot irradiate the whole lateral surface area of the object CB, the object table 90 moves in parallel with the X axis. The object table 90 is configured to move on the X axis, as well as on the Z axis in order to be placed at the focal points of the projection optical systems 60-1 to 60-8.

<Position of Aperture Member>

The aperture member 20-1 (or 20-2) is located so as to be exposed to the collimated light beam in the lighting system 30-1 (or 30-2). Now, an explanation is given, of why the opening windows 21 are not positioned in accordance with "Helmholtz-Lagrange invariant."

In a typical optics for projecting an image, the light beam outputted from an optical element such as a lens has the following relationship;

$$PA \cdot LA = PB \cdot LB \text{(Helmholtz-Lagrange invariant)}$$

where "PA" is a height of the image on the incident side, "LA" is the incident distance, "PB" is the height of the image on the projected side, and "LB" is the projected distance.

Consider that a single optics in which an optical element such as a lens forms an image of an object. In this optics, a ratio of the height of the object to that of the image (lateral magnification) is inversely proportional to a ratio of the angle of the object to that of the image with respect to an axis of the optical element (angular magnification). If a collimated light beam is incident on an optical element, then a projected image is limited by a distance and an angle at which the light beam converges or diverges. Thus, the relationship between the angle and distance of the light beam, that is, the NA of the optical element is related to the image-forming property of the optical element. In other words, the projected image is confined by the relationship between the NAs of the optical element on the object side and on the image side.

The devices of JP A 2006-337475 and JP A 2006-343684, as shown in FIG. 6 of those documents, have an optical system in which the light beam from the light source is converged, and the converged light beam is guided and focused on the final target surface.

On the other hand, in the exposure device 100 of this embodiment, the light beams are not focused. Specifically, the plate-shaped aperture members 20-1 and 20-2 each of which has the four rectangular opening windows 21 are placed into the collimated beams while being perpendicular to them. When entering the aperture member, the light beam is split into four. In consideration of this fact, the relationship between the light beam inputted to the aperture member and the light beams outputted therefrom is not compliance with the Helmholtz-Lagrange invariant. Hence, the aperture member can produce ideal four images with the constant magnification.

<Aperture Member to DMD>

Figure 3:
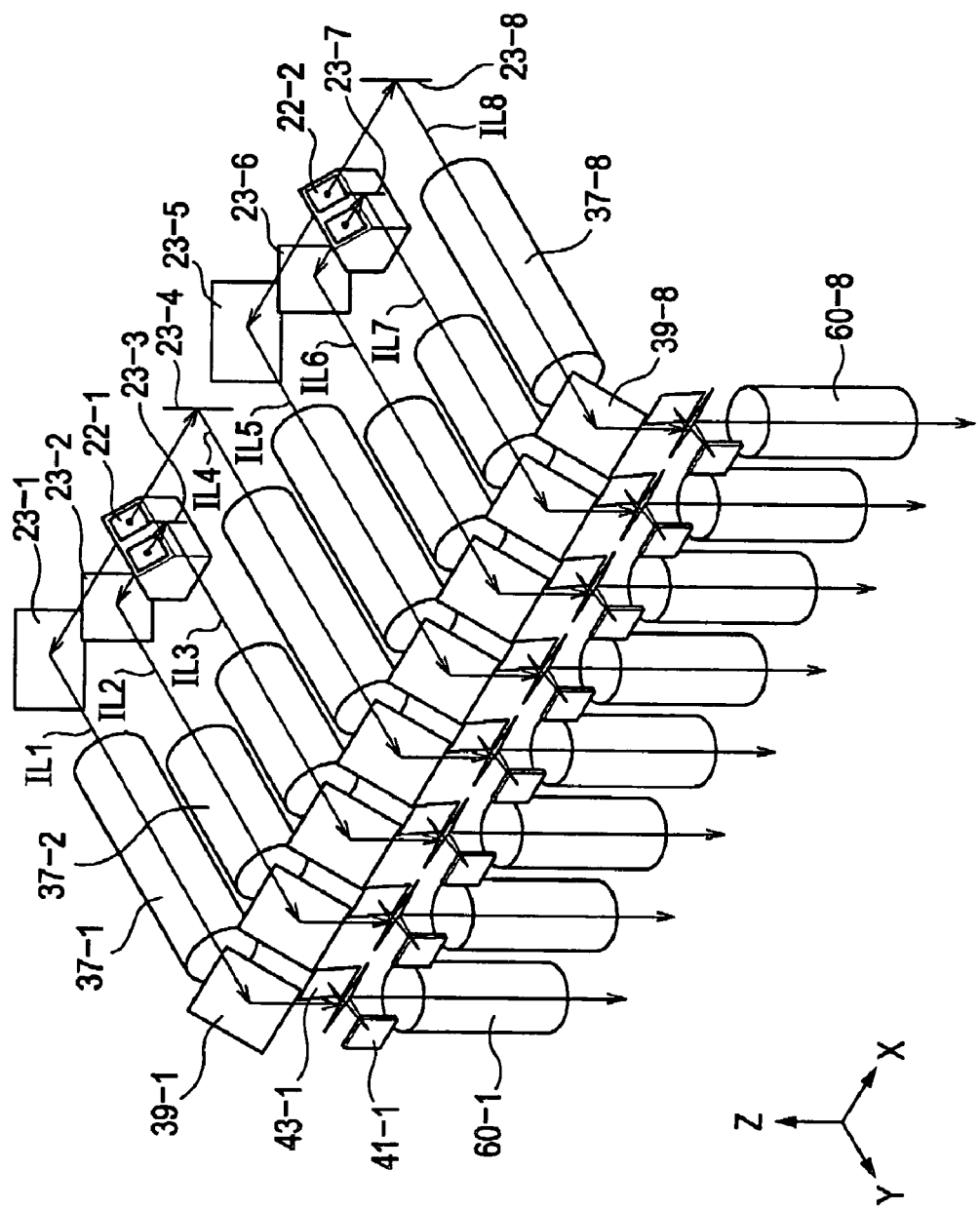
FIG. 3 is a schematic view depicting light guiding systems 37-1 to 37-8, DMDs 41-1 to 41-8 and projection optical systems 60-1 to 60-8 of the exposure device 100.
Figure 5:
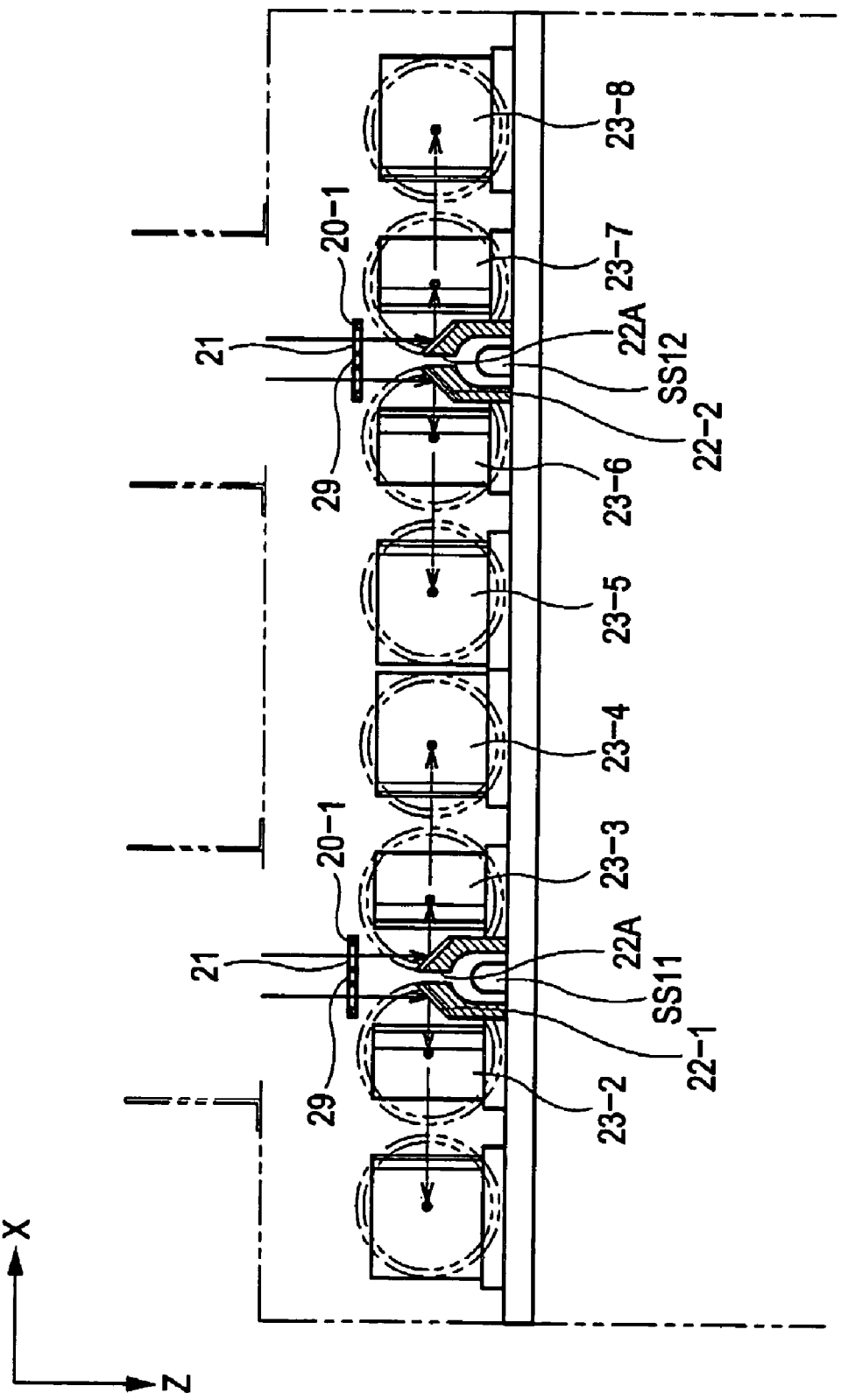
FIG. 5 is a schematic view depicting reflective optical elements 22-1 and 22-2 and total reflection mirrors 23-1 to 23-8 of the exposure device 10 as seen on a Y axis.

FIG. 3 shows the light guiding systems 37-1 to 37-8, the DMDs 41-1 to 41-8 and the projection optical systems 60-1 to 60-8. FIG. 5 shows the reflective optical elements 22-1 and 22-2 and the total reflection mirrors 23-1 to 23-8 as seen on the Y axis.

After passing through the aperture members 20-1 and 20-2, the eight light beams IL travel in parallel with the Z axis. Then, the light beams IL are reflected by a corresponding one of the reflective optical elements 22-1 and 22-2 that are constituted by flat mirrors or prisms. The reflected light beams IL travel in parallel with the X axis. Specifically, the four light beams IL that have been formed by the aperture member 20-1 are reflected by the reflective optical element 22-1. Subsequently, those four beams travel along paths IL1, IL2, IL3 and IL4 in parallel with the X axis, respectively. Likewise, the other four light beams IL, which are formed by the aperture member 20-2, are reflected by the reflective optical element 22-2 and, then travel along light paths IL5, IL6, IL7 and IL8 in parallel with the X axis, respectively. The eight light beams traveling along the paths IL1 to IL8 are reflected by the total reflection mirror 23-1 to 23-8, and are directed toward the DMDs 41-1 to 41-8 in parallel with the Y axis, respectively.

The light beams IL reflected from the total reflection mirrors 23-1 to 23-8 travels to the DMDs 41-1 to 41-8 through the light guiding systems 37-1 and 37-8, respectively. Each of the light guiding systems 37-1 and 37-8 is constituted by an iris adjuster 35 and other optical components such as lenses. As shown in FIG. 3, the light paths IL1, IL4, IL5 and IL8 (that extend between the total reflection mirror and the DMDs) have the same length. Also, the light paths IL2, IL3, IL6 and IL7 are equal in length. However, each length of the light paths IL1, IL4, IL5 and IL8 is different from that of the light paths IL2, IL3, IL6 and IL7. After reflected by the DMDs 41-1 to 41-8, the light beams IL pass through the projection optical systems 60-1 to 60-8, respectively. Finally, they are irradiated to the object CB. Note that the light beams IL must have the same beam shape when irradiated to the object CB. However, unless all the distances between the DMDs 41-1 to 41-8 and the object CB are the same, the resolution, dimension and other properties of patterns formed on the object CD may differ depending on the light beams IL. In consideration of this fact, the light beams IL that travel along the paths IL1 to IL8 and that have been reflected from the total reflection mirrors 23-1 to 23-8, respectively are corrected to have the same focal length. After the correction, the beams are incident on the DMDs 41-1 to 41-8. Needless to say, if the lengths of the light paths IL1 to IL8 are different from one another in contrast to the configuration of FIG. 3, then all the light beams IL must be corrected individually.

Figure 4:
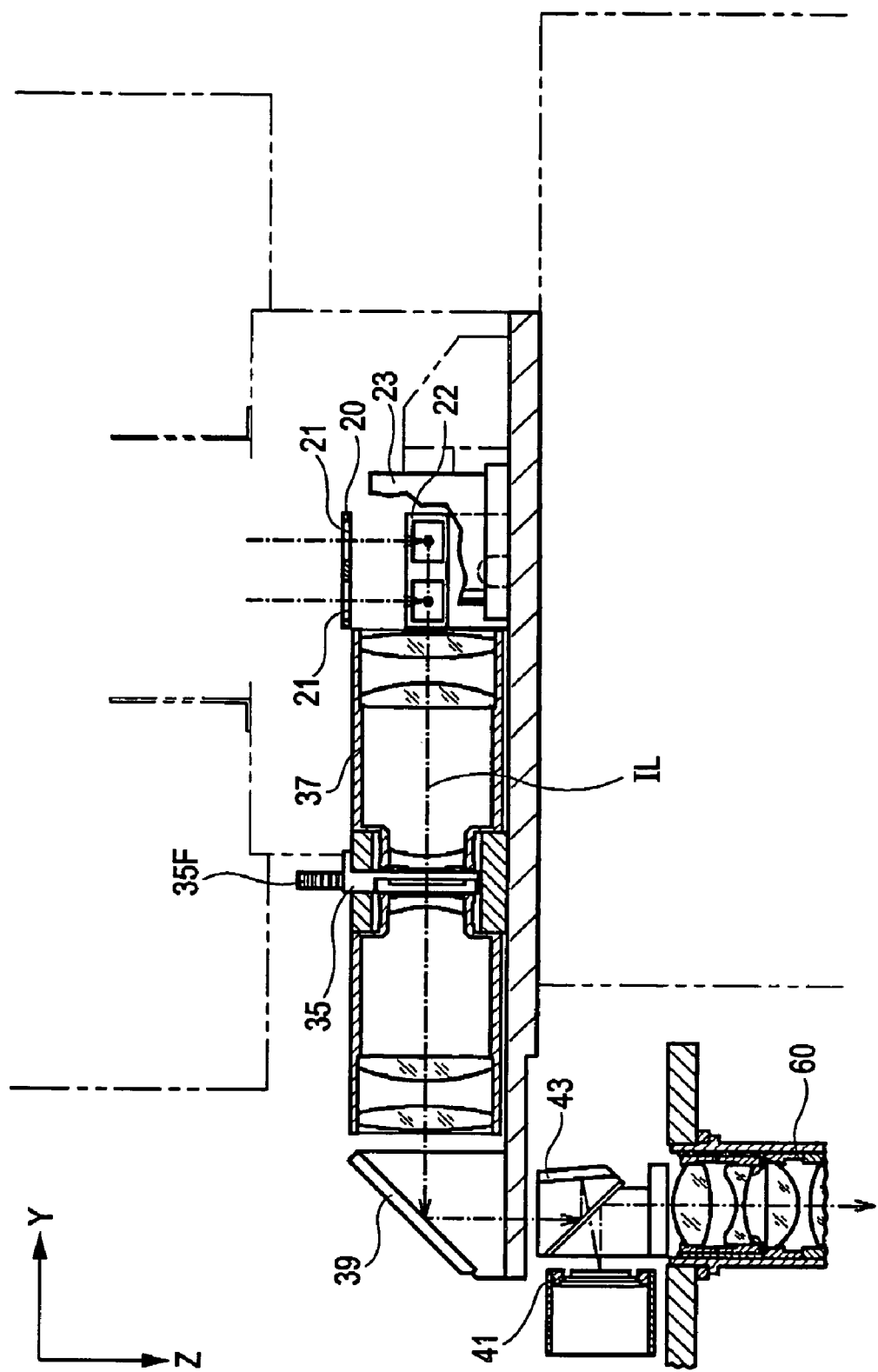
FIG. 4 is a view depicting a Y-Z cross-section of a light guiding system 37 of the exposure device 10.

FIG. 4 shows a cross section of one of the light guiding systems 37-1 to 37-8. In this drawing, a reference numeral 20 indicates an aperture member that represents any one of the aperture members 20-1 and 20-2. Likewise, a reference numeral 23 indicates a total reflection mirror that represents any one of the total reflection mirrors 23-1 to 23-8. A reference numeral 22 indicates a reflective optical element that represents any one of the reflective optical elements 22-1 to 22-2. A reference numeral 37 indicates a light guiding system that represents any one of the light guiding systems 37-1 to 37-8. A reference numeral 39 indicates a mirror that represents any one of mirrors 39-1 to 39-8 (see FIG. 1). A reference numeral 41 indicates a DMD that represents any one of the DMDs 41-1 to 41-8. A reference numeral 43 indicates a reflection prism that represents any one of reflection prisms 43-1 to 43-8 (see FIG. 1). A reference numeral 60 indicates a projection optical system that represents any one of the projection optical systems 60-1 to 60-8.

The light beam IL passes through the aperture member 20 and is then reflected by the reflective optical element 22 and the total reflection mirror 23 in this order. Following this, the light beam IL reaches the DMD 41 through the light guiding system 37 that is constituted by the iris adjuster 35 and other optical components such as lenses.

The iris adjuster 35 is provided with an iris window that is located perpendicular to the optical axis of the light beam IL as shown in FIG. 4. Further, the inner window area of this window is set such that the intensities of all the light beams IL are nearly equal. The size of this window area may be varied by, for example, a motor. Alternatively, it may be fixed and preset based on the measurement result of intensity of the light beam IL.

The iris adjuster 35 receives an approximately quarter of the whole light or heat emitted from the high pressure mercury lamp 10-1 or 10-2. When the iris adjuster 35 slightly closes the iris window to attenuate the light beam IL, the beam impinges on the inner edge of the iris adjuster 35 and heads it. Accordingly, the iris adjuster 35 may have a blade-shaped heatsink 35F for receiving coolant from a cooled nozzle, thereby preventing the excessive temperature rise of the iris adjuster 35 itself. The heatsink 35F may be composed of multiple flat plates.

After passing through the light guiding system 37, the light beam IL is reflected by the mirror 39. Subsequently, the reflected light beam IL travels in parallel to the Z axis, and reaches the reflection prism 43. The reflection prism 43 allows the light beam IL to be curved and directed toward the DMD 41 and, then reflects the light beam IL returned from the micro mirrors M of the DMD 41 toward the projection optical system 60.

FIG. 5 shows the reflective optical elements 22-1 to 22-2, and the total reflection mirrors 23-1 to 23-8.

Referring to this drawing, each of the reflective optical elements 22-1 to 22-2 has, at its center, a light-transmitting zone 22A formed of a through-hole. Under the light-transmitting zone 22A, a first optical sensor SS1 or a second optical sensor SS2 is located. The first and second optical sensors SS1 and SS2 detect the light intensities of the high pressure mercury lamps 10-1 and 10-2 respectively.

Figure 6A:
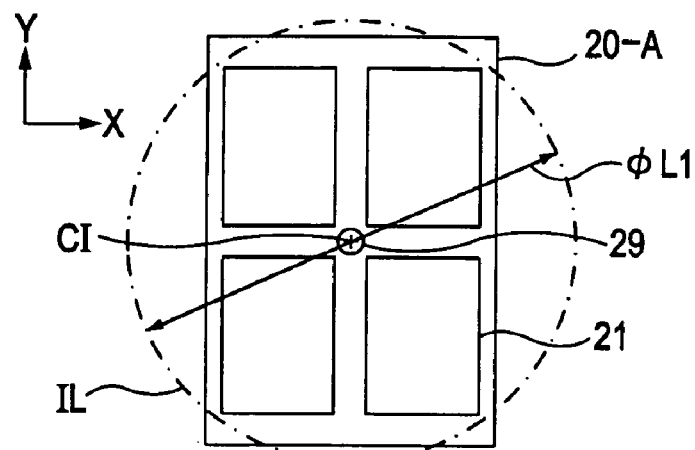
FIG. 6A is a view depicting an example of the aperture member of the exposure device 100.
Figure 6B:
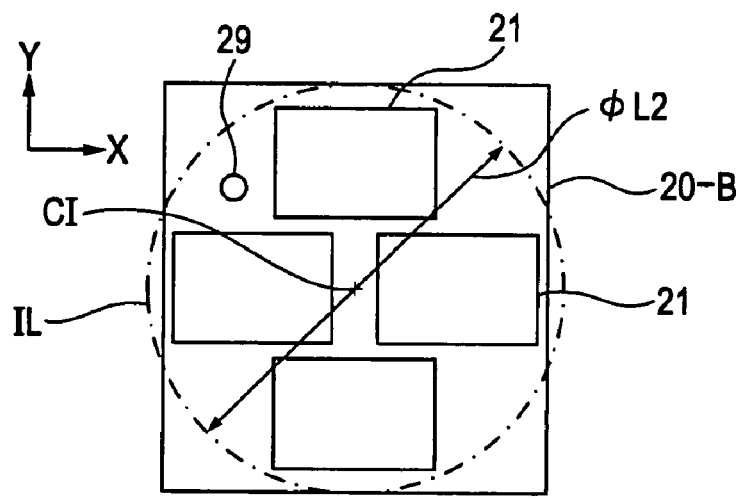
FIG. 6B is a view depicting another example of the aperture member of the exposure device 100.
Figure 6C:
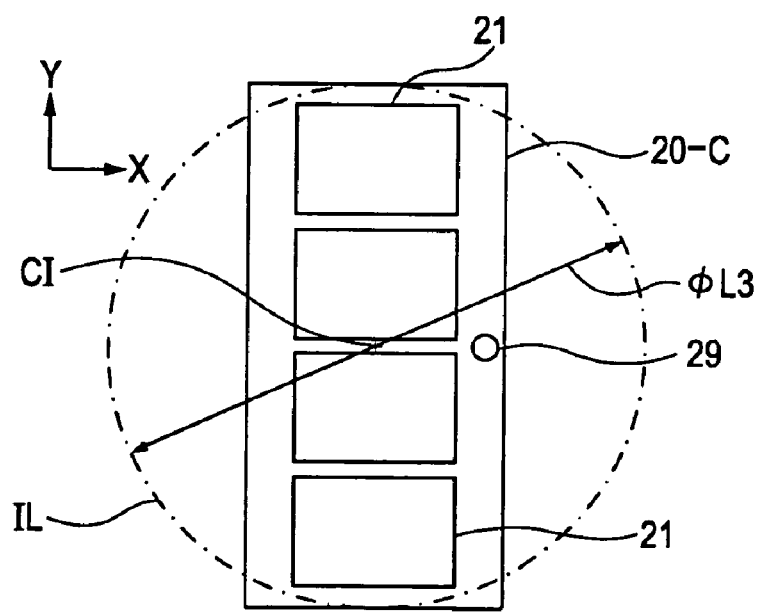
FIG. 6C is a view depicting still another example of the aperture member of the exposure device 100.

FIGS. 6A to 6C depict any one of the aperture members 20-1 and 20-2 (20-A, 20-B and 20-C, respectively). Each of the aperture members 20-1 and 20-2 is made of a material having a low thermal storage property and a low thermal expansion coefficient, such as metal or ceramics. This reason is that since partially exposed to the light beams IL, the aperture members 20-1 and 20-2 tend to be heated. Furthermore, the aperture members 20-1 and 20-2 may be provided with a heat sink in order to decrease the level of the deformation due to the thermal expansion.

The opening windows 21 in each of the aperture members 20-1 and 20-2 are as many as the DMDs 41-1 to 41-8. Each reflective surface of the DMD may be 14 mm by 12 mm in size. The light beam IL irradiated to the DMDs needs to have a rectangular shape in accordance with that of the reflective surface. Furthermore, the light beams IL are required to be as many as the reflective surfaces of the DMDs.

The exposure device 100 is constituted by the two aperture members (20-1 and 20-2), the eight DMDs (41-1 to 41-8) and the four projection optical systems (60-1 to 60-8). Therefore, each of the aperture members 20-1 and 20-2 has four rectangular windows 21 that are placed within the light beam IL drawn by a dashed line in order to split the single light beam IL into four light beams IL, as shown in FIGS. 6A to 6C.

Referring to FIG. 6A, an aperture member 20-A has rectangular windows 21 which are arranged at 45, 135, 225 and 315 degree, respectively with respect to a line which is parallel to the X axis and passes through a point CI located at substantially the center of the light beam IL as well as the aperture member 20-A. In other words, the rectangular windows 21 are positioned at 45, 135, 225 and 315 degree, respectively with respect to one line of any of the rectangular windows 21. Furthermore, the aperture member 20-A has a circular detection window at its center. This detection window has a diameter of 3 mm to 5 mm and is used to detect the intensity of the light beam IL. The shape of the detection window 29 is not limited to a circular shape. Alternatively, it may be a rectangular shape. Moreover, the detection window 29 may be provided at any location inside the light beam IL, because the density of the light beam IL is uniform.

Referring to FIG. 6B, an aperture member 20-B has rectangular windows 21 which are arranged at 0, 90, 180 and 270 degree, respectively with respect to a line which is parallel to the X axis and passes through a center CI located at substantially the center of the light beam IL as well as the aperture member 20-B. Moreover, it has the detection window located at 135 degree.

Referring to FIG. 6C, an aperture member 20-C has four rectangular windows 21 arrayed on a line which is parallel to the Y axis and passes through a point CI located at substantially the center of the light beam IL as well as the aperture member 20-C. Furthermore, a detection window 29 is provided away from the Y axis.

The arrangement of the rectangular windows 21 in the aperture member is not limited to that of FIG. 6A, 6B or 6C. However, it needs to be determined based on the number of the DMDs, the size of the reflection surfaces of the DMDs, and a relationship between the pre-split light beam IL and the split light beams IL. The diameter of the light beam IL is related to that of various optical members. Specifically, as the diameter of the light beam IL is smaller, the optical members are downsized, that is, its material cost is on the decrease. It can be found that the diameter L2 of the light beam IL in FIG. 6B is the smallest of the diameters L1, L2 and L3 of the light beam IL in FIGS. 6A, 6B and 6C, respectively. In consideration of this fact, the aperture member 20-B can be the most preferable on the condition that the number of the DMD is four and the reflection surface of each DMD is 14 mm by 12 mm in length.

However, the arrangement of the rectangular windows 21 in the aperture members 20-1 and 20-2 must be determined in view of not only the above fact but also the dimensions of plane mirrors and prisms constituting the reflective optical elements 22-1 and 22-2 and the arrangement of the total reflection mirrors 23-1 to 23-8 located downstream from the aperture members 20-1 and 20-2. Accordingly, taking all the factors into account, the arrangement of FIG. 6A is employed in this embodiment.

In this embodiment, the light beams IL that are outputted from the aperture members 20-1 and 20-2 have the same diameter as those of the light beams IL that are incident on the DMDs 41-1 to 41-8. Therefore, the rectangular window 21 is adapted to have the same size at that of the reflection surface of the DMD. If the light guiding systems 37-1 to 37-8 do not have the magnification of 1:1, then the size of the rectangular window 21 may be different from the reflection surface, depending on the magnification.

<Second Light Guiding System (Aperture Members to DVDs)>

Figure 7:
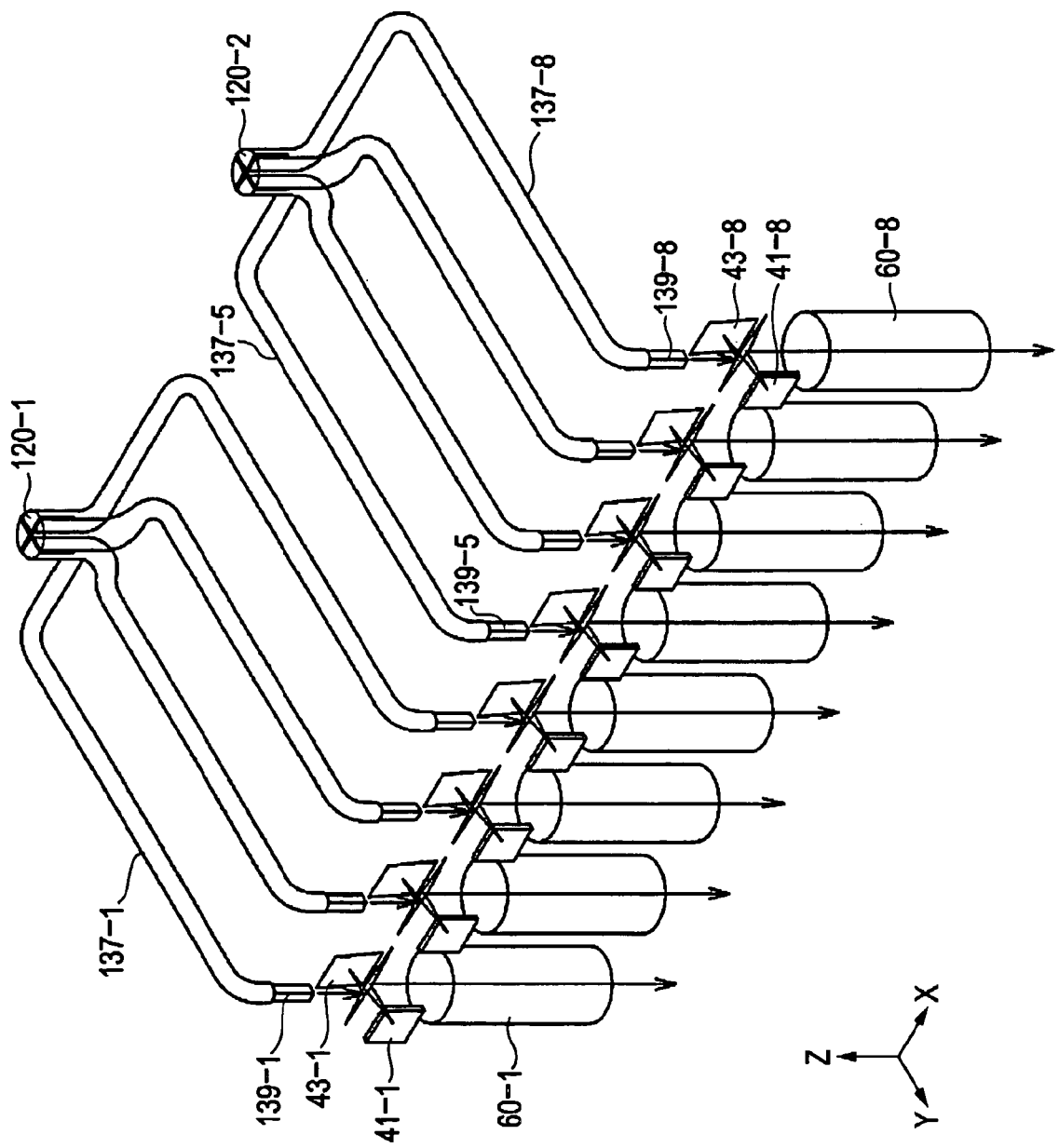
FIG. 7 is a schematic view depicting second light guiding systems 137-1 to 137-8, the DMDs 41-1 to 41-8 and the projection optical systems 60-1 to 60-8 of the exposure device 100.
Figure 8:
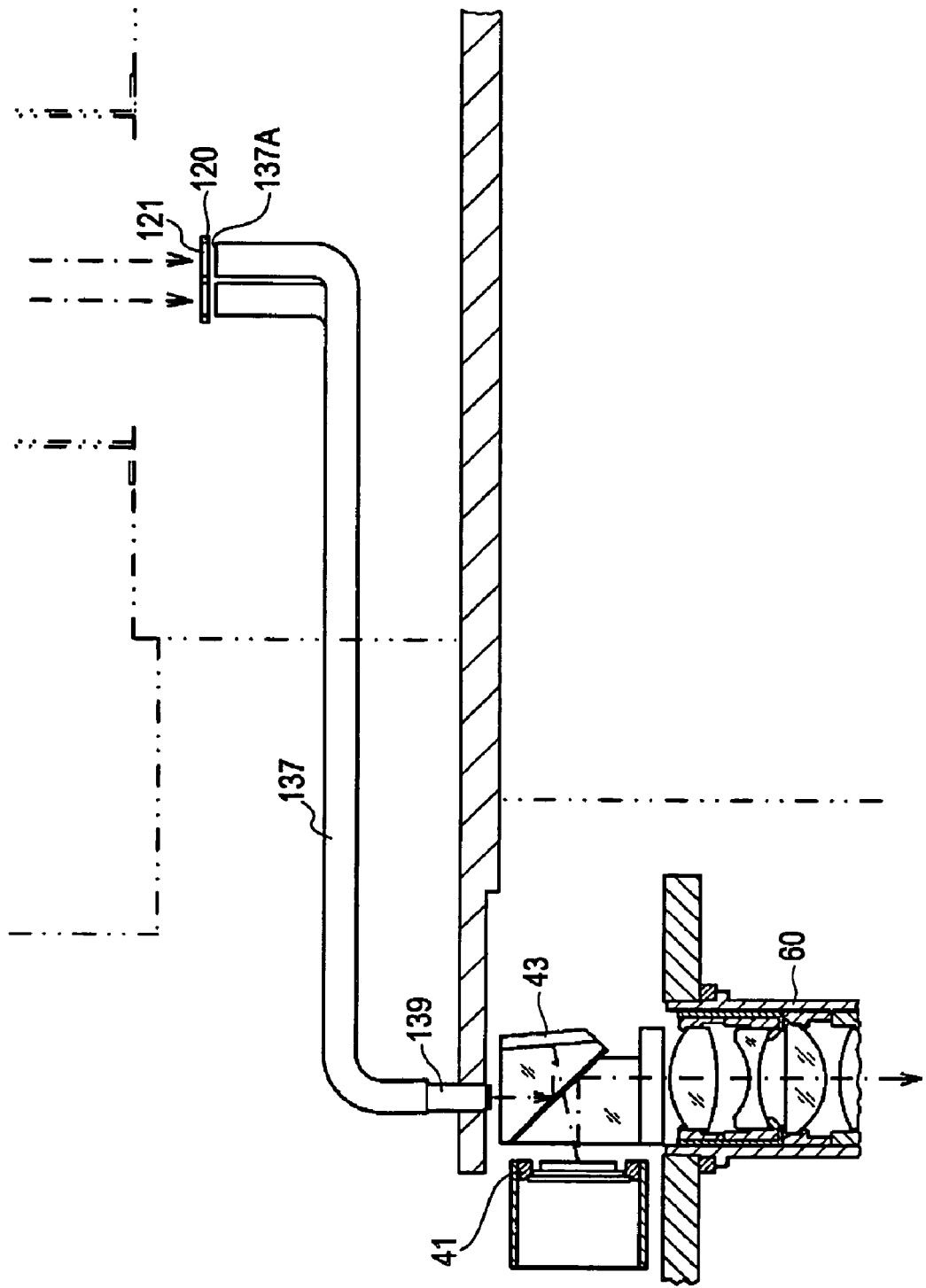
FIG. 8 is a view depicting a Y-Z cross-section of a second light guiding system 137 of the exposure device 100.

FIG. 7 schematically shows second light guiding systems 137-1 to 137-8 (branched optical fibers), the DMDs 41-1 to 41-8 and the projection optical systems 60-1 to 60-8. FIG. 8 shows a cross-section of the second light guiding systems 137-1 to 137-8 taken along the Y and Z axes of FIG. 7. The same reference numerals are given to the same parts of FIGS. 3 and 4. In FIG. 8, a reference numeral 120 denotes any one of second aperture members 120-1 and 120-2, 137 is any one of the second light guiding systems 137-1 to 137-8, and 139 is any one of frame bodies 139-1 to 139-8.

The light beams pass through the second aperture member 120 and are then inputted to the branched fiber 137 through an input surface 137A. In this embodiment, the branched fiber 137 splits the light beam into four. The branched fiber 137 is composed of a bundle of fibers, and the input surface 137A can have various shapes such as circular or fan shape by changing its bundle form. Moreover, the output surface of the branched fiber 137 may have a rectangular shape. When being inputted to the branched fiber 137, the light beam is reflected inside the fibers, and the light of uniform density is outputted therefrom. The light beam from the branched fiber 137 reaches the reflection prism 43. The reflection prism 43 changes its angle so as to lead the light beam IL to the DMD 41 as well as to the projection optical system 60.

It is preferable that the output surface of the branched fiber 137 has the same shape as that of the reflection surface of the DMD 41. This enables the light to be irradiated uniformly on the reflection surface of the DMD 41. Accordingly, the frame bodies 139-1 to 139-8 (139 in FIG. 8) are coupled to the output ends of the blanched fibers 137-1 to 137-8, respectively. If the intensities of the light beams IL from the branched fibers 137-1 to 137-8 need to be adjusted, then variable iris mechanisms are provided near the input ends of the branched fibers 137-1 to 137-8, respectively.

<Second Aperture Member>

Figure 9A:
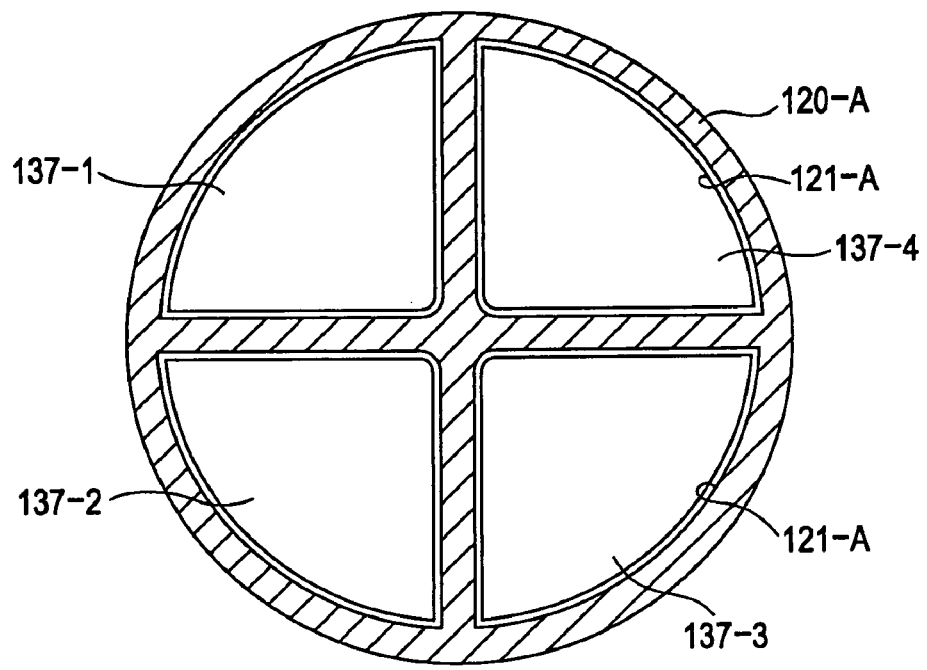
FIG. 9A is a view depicting an example of an aperture member in the second light guiding system 137.
Figure 9B:
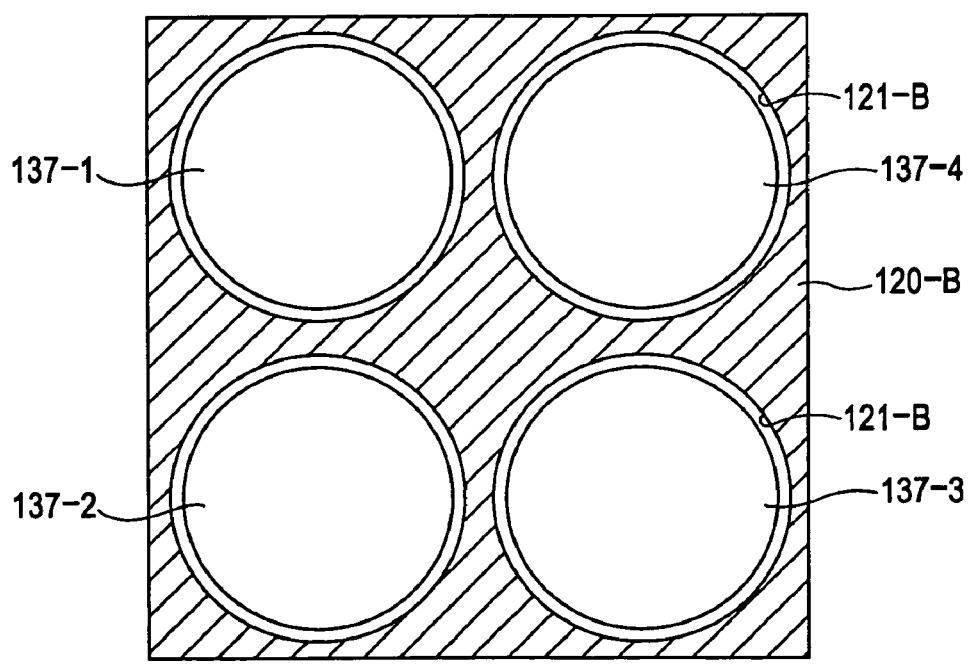
FIG. 9B is a view depicting another example of an aperture member in the second light guiding system 137.

FIGS. 9A and 9B show an example of the second aperture member 120. It is preferable that the second aperture member 120 is made of material having a low thermal storage property and a low thermal expansion coefficient, such as metal or ceramics. The aperture windows of the second aperture member 120 may have various shapes, because each of the branched fibers 137-1 to 137-8 is composed of multiple thin fibers as described above.

Referring to FIG. 9A, the second aperture member 120 (120-A) has four fan-shaped aperture windows 121-A, each of which matches with the input surface 137A of the branched fiber 137. The shape formed by joining the four fan-shaped aperture windows 121A together is identical to that of the light beam focused by the condenser lens 33-1 through the fly-eye lens 32-1.

Light is attenuated by an optical fiber, because the light is reflected therein multiple times. However, the second aperture member 120-A splits the circular light beam IL into the four beams, and the light beams outputted from the blanched fibers 137-1 to 137-4 each have substantially the same shape as that of the DMD 41. As a result, using the aperture member 120-A enables the light beams to be delivered with minimum optical loss.

Meanwhile, referring to FIG. 9B, the second aperture member 120 (120-B) has four circular aperture windows 121-B. It is easy to match the shape of the bundle of fibers with that of the aperture window 121-B. In other words, with this aperture member, the branched fibers are easy to fabricate.

<DMD>

Figure 10A:
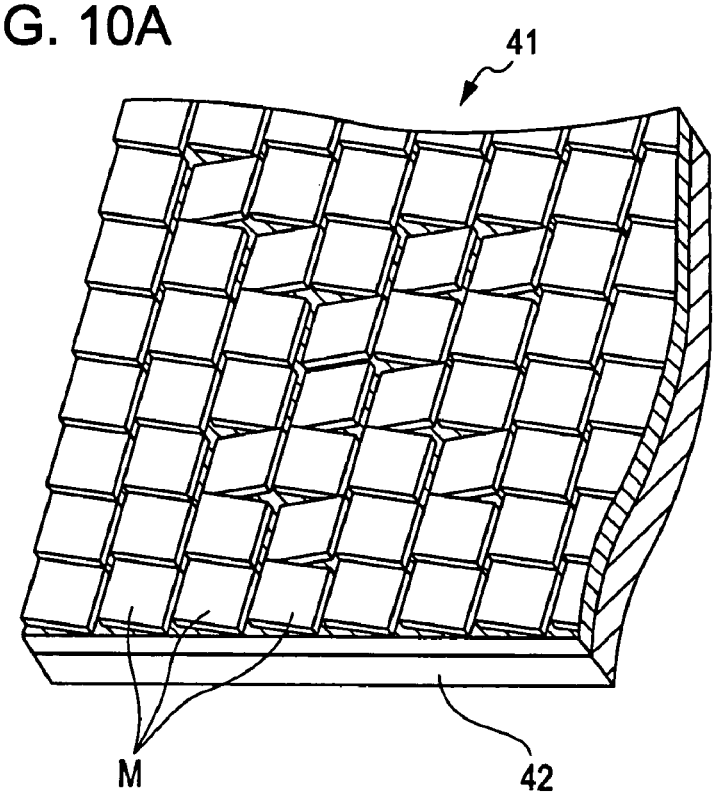
FIG. 10A is a schematic view depicting a DMD 41.
Figure 10B:
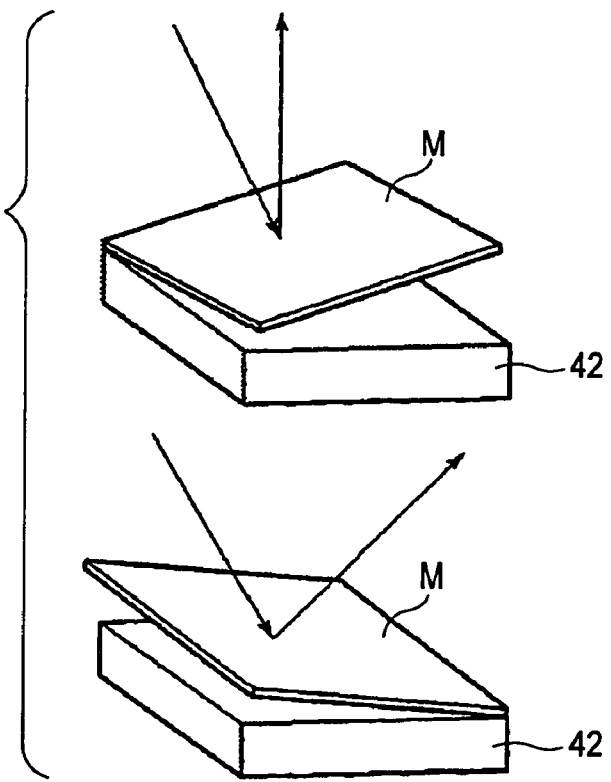
FIG. 10B is a schematic view depicting the operation of the micro mirror M.

FIG. 10A shows the DMD 41 that represents any one of the DMDs 41-1 to 41-8, and FIG. 10B shows the function of the micro mirror M. In this embodiment, the exposure device 100 has the eight DMDs, and its reflection surface is composed of, for example, 1310720 (1024 by 1280) micro mirrors M arranged in a matrix fashion. In the DMD 41, the 1024 micro mirrors M are arrayed on the X side and 1280 micro mirrors M are arrayed on the Y side. The reflection surface of the DMD 41 is about 12 mm long on the X axis and 14 mm long on the Y axis. Each micro mirror M is about 11.5 square Πm long.

The micro mirror M has a high reflection coefficient and is fabricated by subjecting an aluminum sputtering treatment to a wafer 42. The DMD 41 swivels the micro mirrors M by means of static electricity. As shown in FIG. 10B, the micro mirror M can be swiveled around the diagonal lines and have two stable orientations. Once the micro mirror M (m, n) ($1 \leq m \leq 1024$, $1 \leq n \leq 1280$) is positioned facing the object CB, the light beam IL reflected by the DMD 41 travels toward the projection optical system 60. Otherwise, once the micro mirror M (m, n) does not face the projection optical system 60, the light beam travels to a light absorber (not shown), that is, propagates away from the projection optical system 60.

Figure 11:
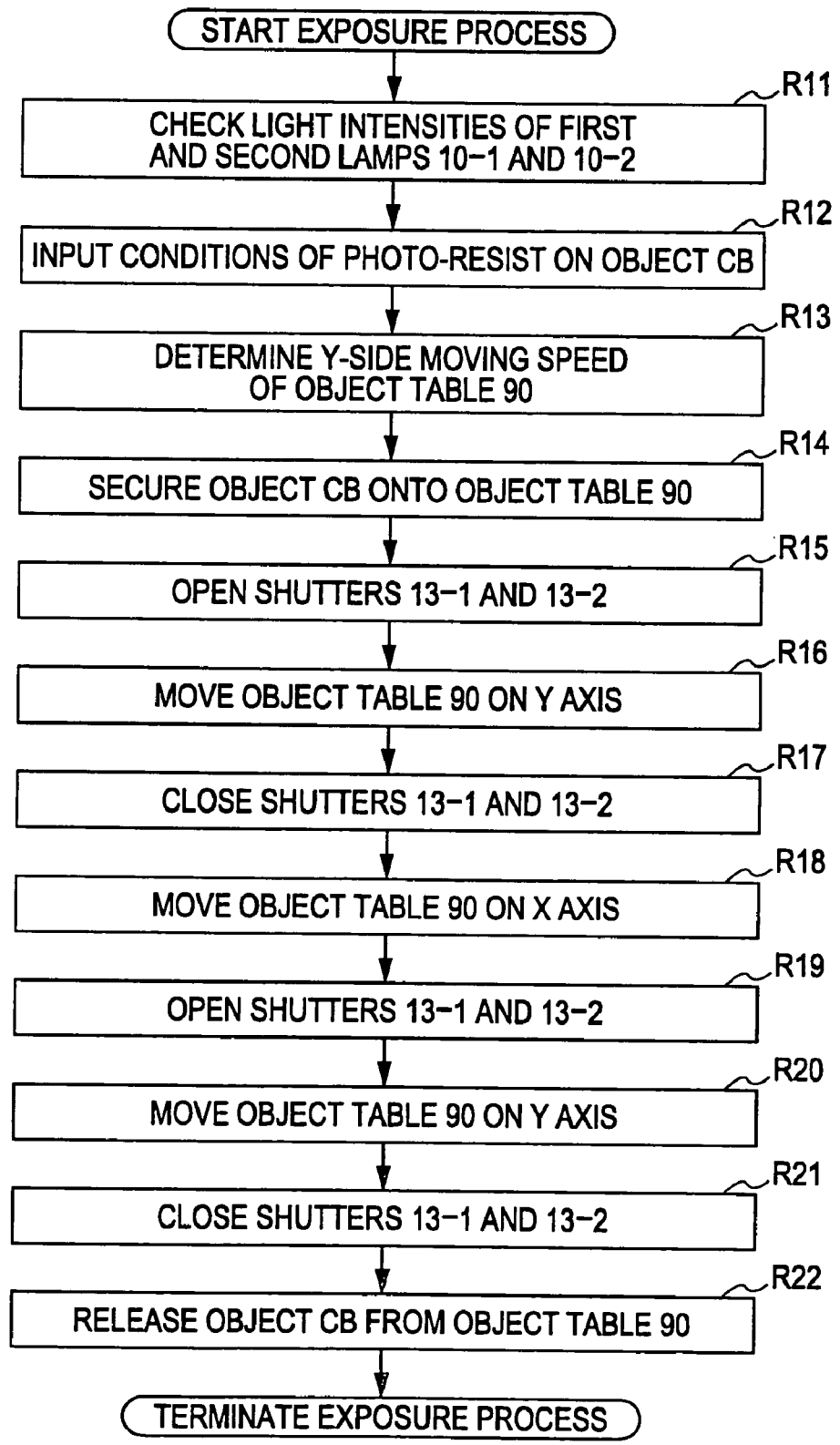
FIG. 11 is a flowchart of an exposure process performed by the exposure device 100.

The above process flow will be described below in detail with reference to the flowchart of FIG. 11.

At a step R11, the exposure device 100 checks the light intensities of the first and second high-pressure mercury lamps 10-1 and 10-2 by using the first optical sensors SS11 and SS12, respectively. Based on the checked result, a power supply controller (not shown) adjusts both light intensities so as to have substantially the same value. After the adjustment is over, the shutters 13-1 and 13-2 block off the light beams IL.

At a step R12, an operator inputs, to the exposure device 100, the conditions of sensibility of the photoresist or the like coated on the object CB.

At a step R13, the exposure device 100 determines a speed at which the object table 90 moves in parallel with the Y axis (or in the direction of the arrow Y of FIG. 1), based on the type of the photoresist coated on the object CB and the light intensities of the first and second high-pressure mercury lamps 10-1 and 10-2.

At a step R14, the object table 90 sucks the object CB by means of negative pressure, so that the object CB is fixed.

At a step R15, the exposure device 100 opens the shutters 13-1 and 13-2. As a result, patterns are being created on the object CB.

At a step R16, the exposure device 100 moves the object table 90 in parallel with the Y axis.

At a step R17, once the exposure blocks SP1 to SP8 reach an edge of the object CB, the shutters 13-1 and 13-2 block off the light beams IL. At this time, the exposure region EX occupies the half area of the object CB.

At a step R18, the exposure device 100 moves the object table 90 in parallel with the X axis.

At a step R19, the exposure device 100 opens the shutters 13-1 and 13-2, so that the patterns are being created on the object CB again.

At a step R20, the exposure device 100 moves the object table 90 in parallel with the Y axis (or in the direction opposite to the arrow Y of FIG. 1).

At a step R21, once the exposure blocks SP1 to SP8 reach the edge of object CB, the shutters 13-1 and 13-2 block off the light beams IL. Now, the exposure region EX occupies the whole area of the object CB.

At a step R22, the object table 90 stops sucking the object CB, and the operator or a transfer machine then removes it from the object table 90.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. An exposure device for forming predetermined patterns onto an object, comprising:
    an optical source for emitting a UV ray;
    a lighting system for shaping the UV ray into a collimated light beam;
    an aperture member having first and second windows, the aperture member for producing first and second light beams based on the collimated light beam by using the first and second windows, the aperture member being located in the collimated light beam;
    first and second light guiding systems for guiding the first and second light beams, respectively;
    first and second spatial light modulators for spatially modulating the first and second light beams that are guided by the first and second light guiding systems, respectively; and
    first and second projection lighting systems for guiding the modulated first and second light beams to the object.

2. The exposure device according to claim 1,
    wherein each of the first and second spatial light modulators has a rectangular reflection surface that includes a plurality of reflection elements, and
    wherein each of the first and second windows of the aperture member has the substantially the same shape as that of the reflection surface of each of the first and second spatial light modulators.

3. The exposure device according to claim 2,
    wherein each of the first and second light guiding systems includes one or two total reflection elements.

4. The exposure device according to claim 2,
    wherein each of the first and second light guiding systems has an iris adjustor which adjusts intensity of light by varying its opening area and which has a heatsink member.

5. The exposure device according to claim 3,
    wherein each of the first and second light guiding systems has an iris adjustor which adjusts intensity of light by varying its opening area and which has a heatsink member.

6. The exposure device according to claim 1,
    wherein each of the first and second spatial light modulators has a rectangular reflection surface that includes a plurality of reflection elements; and
    wherein each of the first and second windows of the aperture member has a fan-shape.

7. The exposure device according to claim 6,
    wherein each of the first and second light guiding systems comprises a bundle of optical fibers, an end of which faces the aperture member and has a fan-shape in cross-section, and the other end of which faces the first and second spatial light modulators and has a rectangular shape in cross-section.

8. An exposure device for forming predetermined patterns onto an object, comprising:
    first and second optical sources for emitting UV rays;
    first and second lighting systems for shaping the UV rays from the first and second light sources into first and second collimated light beams, respectively;
    a first aperture member having four windows, the first aperture member for splitting the first collimated light beam into four light beams by using the windows, the first aperture member being located in the first collimated light beam;
    a second aperture member having four windows, the second aperture member for splitting the second collimated light beam into four light beams by using the windows, the second aperture member being located in the second collimated light beam;
    first to fourth light guiding systems for guiding the four light beams split by the first aperture member, respectively;
    fifth to eighth light guiding systems for guiding the four light beams split by the second aperture member, respectively;
    first to fourth light spatial light modulators for spatially modulating the four light beams guided by the first to fourth light guiding systems, respectively;

fifth to eighth light spatial light modulators for spatially modulating the four light beams guided by the fifth to eighth light guiding systems, respectively; and
first to eighth projection lighting systems for guiding the light beams modulated by the first to eighth spatial light modulators to the object, respectively.

9. The exposure device according to claim 8,
wherein each of the first to eighth spatial light modulators has a rectangular reflection surface that includes a plurality of reflection elements, and
wherein each of the eight windows of the first and second aperture members has the substantially the same shape as that of the reflection surface of each of the first to eighth spatial light modulators.

10. The exposure device according to claim 9,
wherein each of the first to eighth light guiding systems includes one or two total reflection elements.

11. The exposure device according to claim 9,
wherein each of the first to eighth light guiding systems has an iris adjustor which adjusts intensity of light by varying its opening area and which has a heatsink member.

12. The exposure device according to claim 10,
wherein each of the first to eighth light guiding systems has an iris adjustor which adjusts intensity of light by varying its opening area and which has a heatsink member.

13. The exposure device according to claim 8,
wherein each of the first to eighth spatial light modulators has a rectangular reflection surface that includes a plurality of reflection elements, and
wherein each of the eight windows of the first and second aperture members has a fan-shape.

14. The exposure device according to claim 13,
wherein each of the first to eighth light guiding systems comprises a bundle of optical fibers, an end of which faces the first and second aperture members and has a fan-shape in cross-section, and the other end of which faces the first to eighth spatial light modulators and has a rectangular shape in cross-section.

* * * * *